Nov. 21, 1961 R. EMEIS 3,009,840

METHOD OF PRODUCING A SEMICONDUCTOR DEVICE OF THE JUNCTION TYPE

Filed Feb. 3, 1959

United States Patent Office 3,009,840
Patented Nov. 21, 1961

3,009,840

METHOD OF PRODUCING A SEMICONDUCTOR DEVICE OF THE JUNCTION TYPE

Reimer Emeis, Ebermannstadt, Upper Franconia, Germany, assignor to Siemens-Schuckertwerke Aktiengesellschaft, Berlin-Siemensstadt and Erlangen, Germany, a German corporation Filed Feb. 3, 1959, Ser. No. 790,877
Claims priority, application Germany Feb. 4, 1958
11 Claims. (Cl. 148—1.5)

My invention relates to electric semiconductor devices, such as rectifiers, transistors or photodiodes, of the junction type.

Such devices comprise a preferably monocrystalline semiconductor body of germanium, silicon, or of an intermetallic compound, such as indium arsenide or indium antimonide, formed of respective elements from the third and fifth b-groups of the periodic system. The latter compounds are the $A_{III}B_{V}$ compounds of the type defined in Welker Patent 2,798,989, issued July 9, 1957. They are compounds of an element selected from boron, aluminum, gallium, indium with an element selected from nitrogen, phosphorus, arsenic, and antimony; for example InSb, InAs, AlAs, and GaP. The semiconductor body is provided with mutually adjacent zones that are differently doped with donor or acceptor atoms in order to provide at least one p-n junction. As a rule, the semiconductor devices are produced by first purifying the semiconductor material as much as is feasible, and then doping a shaped body of the pure material at the proper localities with lattice-defection atoms in order to obtain the desired conductance characteristic. In this manner, p-type conductance is obtained in a monocrystalline body of silicon by doping it with aluminum.

Relating to the doping of monocrystalline silicon with acceptor atoms to produce a zone of p-type conductance, it is an object of my invention to devise a doping method that yields a higher acceptor concentration than is obtainable with aluminum.

According to my invention a p-n junction and the appertaining terminal contact of the semiconductor device having a monocrystalline body of silicon are produced by alloying a metal or metal alloy together with the silicon and adding boron to the silicon alloy thus produced.

According to another, preferred feature of my invention, gold is used in order to form a diffusion alloy zone together with the silicon, and boron is added to the gold-silicon alloy. This can be done by placing a gold foil on a silicon disc, then depositing boron on the gold foil, and alloying the entire assembly together under simultaneous application of mechanical pressure, preferably at temperatures of approximately 400 to 500° C. The boron is preferably used in amorphous and pulverulent form. However, boron compounds, for example boric acid, are also suitable. The boron-containing doping powder is sprinkled upon the gold foil prior to the alloying treatment, or the doping powder is rolled under pressure into the gold foil. Another way of applying the boron is to form a suspension of boron in alcohol and to place the suspension upon the gold foil or upon a pressure body which is in contact with the gold foil during the alloying operation. The suspension can be applied to the foil by means of a brush, for example.

In my copending application, Serial No. 637,029, filed January 29, 1957, now Patent 2,960,419, issued November 15, 1960, assigned to the assignee of the present invention, there is disclosed a method according to which the alloy-bonding of metal foils and other metal layers to the surface area of a semiconductor disc is performed by embedding the semiconductor disc with all metal components, if desired also inclusive of a carrier body of tungsten or molybdenum, in a neutral powder such as graphite, magnesium oxide, or the like. The entire assembly, including the bedding substance, is then compressed and is heated in this condition up to the necessary alloying temperature, a special device being used for thus compressing the assembly during alloying. This alloying method and device, described in my copending application, are particularly well suitable for application of the method according to the present invention. When the doping with boron is to be performed on the upper side of the silicon disc, the gold foil is placed onto the disc, the boron powder is sprinkled thereupon, the embedding powder is poured upon the boron and is thereafter pressed against it, before the assembly is compressed and heated to cause alloying. Another procedure is to admix the boron powder with the embedding powder.

When the bottom side of the semiconductor disc is to be doped with boron, the boron powder is admixed with the lower portion of the powder bed, or is placed upon a rigid support, whereafter the gold foil is placed upon the boron powder or the mixture of boron and bedding powder. Thereafter the semiconductor disc and, if desired, another metal plate and a carrier body are placed upon the gold foil. Ultimately, the top of the assembly is covered with embedding powder which in this case must be free of boron. The procedure described in FIGS. 1 to 8 of my prior application are particularly pertinent here.

Boron is superior to aluminum as an acceptor for the doping of silicon because boron has a higher solubility in the re-solidifying silicon, having a distribution coefficient therein nearly equal to 1, so that a higher doping concentration can be attained. However, there are certain difficulties relative to the entrance or introduction of the boron into silicon. It is already known to dissolve antimony with gold and to then alloy the gold onto the silicon body. During the alloying process the antimony penetrates into the silicon, where it forms an n-type zone. Since boron is practically insoluble in gold, this method cannot be used with boron. Nevertheless, it is preferable for the purpose of my invention to use gold because it affords best results with respect to the desired mutual contacting of the elements of the semiconductor-electrode assembly, on account of the lower alloying temperature of gold with silicon. This facilitates formation of a good contact or bond between the gold and the silicon. This alloying temperature is about 400 to 500° C., in contrast to an alloying temperature of approximately 700° C. with aluminum. The low alloying temperature has the further advantage that the life time of the minority carriers is not as greatly reduced. However, other metals can be used for alloying the silicon, for example silver, copper or nickel.

The alloying process takes place in such a manner that when the gold is heated to about 400 to 500° C. it forms a liquid alloy with a portion of the silicon. The boron penetrates into and through the liquid gold-silicon alloy up to the alloying front. Due to its distribution coefficient being close to unity, the boron that has so penetrated remains, during the subsequent solidification, within the first solidifying, recrystallizing silicon, which again segregates out of the alloy, while the front of the gold-containing alloy somewhat recedes in accordance with the two-substance diagram gold-silicon. The result of this process is a silicon disc which possesses on one side a surface layer consisting of a eutectic gold-silicon disc, and which possesses an intermediate silicon layer highly doped with boron and integral with the interior of the silicon body. An accurate dimensioning of the quantity of boron, when sprinkling or painting it upon the metal foil or when admixing it to the embedding powder, is not required because the final dosage of the boron content in the silicon is essentially determined by the processing temperature. Any excess of boron remains loosely distributed on the surface of the processed silicon body and can be removed, for example by wiping it off.

A preferred embodiment of the invention will be further described with reference to the drawing, in which—

Figure 1:
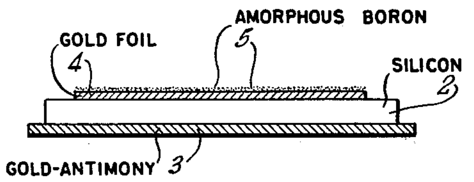
FIG. 1 is a cross-sectional view of the semiconductor assembly prior to the alloying operation.
Figure 2:
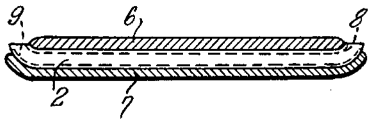
FIG. 2 illustrates the same assembly after completion of the alloying process.

According to FIG. 1 a semiconductor disc 2, for example of silicon, is placed upon a gold-antimony foil 3, preferably having an antimony content of 1%. A gold foil 4 is placed on top, and amorphous boron 5 in pulverulent form is sprinkled thereupon. This assembly is embedded in a neutral powder, for example graphite or magnesium oxide, as described in my copending application Serial No. 637,029 and is then heated under application of mechanical pressure and preferably in an inert atmosphere or in vacuum up to the above-mentioned alloying temperature. Thereafter, the assembly is permitted to cool. The resulting device is schematically shown in FIG. 2. The metal foils are diffusion-alloyed together with and into the semiconductor disc 2 and form a eutectic gold-silicon layer 6 on the upper side and a eutectic gold-silicon-antimony layer 7 on the bottom side of the semiconductor disc. Adjacent to the layer 6 is a boron-doped silicon layer extending down to the broken-line boundary 8. Adjacent to the layer 7 is an antimony-doped silicon layer extending up to the broken-line boundary 9. If the silicon originally used in the process was weakly p-doped, then a p-n junction is now located at 9 between the antimony-containing layer and the interior portion of the disc that remained unaffected by the alloying process. However, if the silicon was originally n-conducting, the p-n junction in the finished product is located at 8 between the boron-doped layer and the interior of the silicon body that remained unaffected.

All of the subject matter of my prior application, Serial No. 637,029, is incorporated herein by reference. The embedding operation illustrated in FIGS. 3, 6 and 8 of said application are all pertinent, with the alternative and variation noted above, namely that the top layer, or covering, of embedding powder can be free of boron, the boron being placed upon the lower inert powder bed, or the metal support or carrier plate, and the gold foil then placed on the boron or on the boron containing graphite powder.

Figure 3:
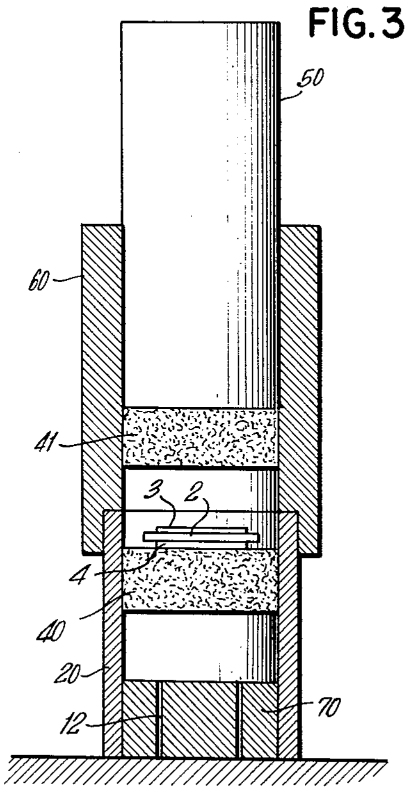
FIG. 3 illustrates an embedded assembly which is to be alloyed together to provide a rectifier or photodiode of the junction type.

In FIG. 3 is shown a tubular piece 20 of metal, for instance of steel or brass, having therein a bottom piston 70 of graphite. At 40 is a compressed pellet of graphite powder, preferably made of colloidal graphite which was pre-compressed under moderate pressure to form a coherent and self-supporting pellet. A second graphite pellet 41 is separately produced in the same manner. An upper tubular piece 60 has an inner shoulder at one end so dimensioned that it fits on the lower thinner-walled piece 20.

Figure 4:
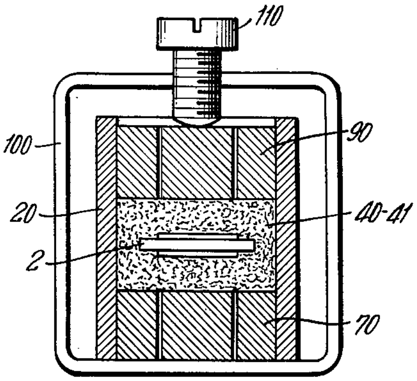
FIG. 4 illustrates the clamping together of the embedded assembly.

After the pellets 40 and 41 are prepared in the above-described manner, the lower tubular member 20, with pellet 40 therein, is placed over graphite piston 70, which may be sawed off a graphite rod and may be provided with a few narrow gas channels 12, as illustrated in FIG. 3. The individual components 2, 3, 4, which are preferably circular and comprise the semiconductor and electrode assembly, can now be placed upon the readily accessible top surface of the pellet 40. That is, the components are loosely placed upon the pellet, preferably in a concentric or coaxial arrangement. By way of example, the disc 2 of p-conducting silicon may be approximately 0.4 mm. in thickness and have a diameter of approximately 10 mm. Placed below the silicon disc is a gold foil 4 having a thickness of about 0.05 mm. On the upper surface of the silicon is a gold-antimony foil 3. After these components of the semiconductor device are assembled, the upper tubular member 60, with the graphite pellet 41 therein, is placed upon the upper end of the tubular member 20. Thereafter the plunger 50 is inserted from above and is slowly forced downwardly so that the pellet 41 and subsequently also the inserted assembly 2, 3, 4 and the pellet 40, are pushed downwardly onto the piston 70. Thereafter a stronger pressure is applied to the piston 50. As a result the pellets 41 and 40 are deformed until the embedded assembly is surrounded on all sides by the graphite powder, which then forms a uniform bedding. After removing the pressure plunger 50 and the upper tubular member 6, the upper end of the tubular member 20 can be closed by means of a second graphite piston 90, as illustrated in FIG. 4. The entire device can be kept together by means of an elastic clamping frame 100 which is preferably provided with a pressure screw 111 to adjust the desired amount of compression.

The procedures described above suffice for carrying out the alloying efficiently. Namely, the silicon disc, with the gold foil placed upon it and with the boron powder sprayed upon the foil, is subjected, at the temperatures stated above, for about 5 to 10 minutes, to a mechanical pressure of about 1 to 2 kg./cm.$^2$, and is thereafter permitted to cool slowly. The same pressure is used for embedding the alloying components into the neutral powder.

I claim:

1. In a method of forming a p-n junction in, and a metallic terminal contact on, a monocrystalline silicon semiconductor body, the improvement comprising contacting gold with a surface of the silicon body, a surface of the gold having in contact therewith a solid phase boron doping substance taken from the group consisting of boron and compounds of boron and oxygen, said gold consisting essentially of gold, unalloyed with the silicon, heating to produce and to melt the gold-silicon alloy formed at said surface, whereby boron penetrates into and through the molten gold-silicon alloy, the temperature being below the melting point of silicon, the boron that has so penetrated advancing to the boundary region of the molten alloy and the unmelted silicon, and during the subsequent solidification the boron thereby being incorporated in the silicon re-solidifying from the melt.

2. The process of claim 1, the said substance being applied to the gold foil in pulverulent and amorphous form.

3. The process of claim 1, the substance being in powder form and being rolled into the gold foil.

4. A method of forming a p-n junction in, and a metal terminal contact on, a monocrystalline silicon semiconductor body, comprising placing a face of a gold foil on said silicon body, then contacting a solid phase substance, taken from the group consisting of boron and compounds of boron with oxygen, with the opposite face of the gold foil, and heating the assembly so produced, together, under application of mechanical pressure, the gold forming an alloy with silicon that melts below the melting point of silicon, the alloy being melted by the heating, the heating being at a temperature below the melting point of the silicon, said gold foil consisting essentially of gold, unalloyed with silicon.

5. A method of forming a p-n junction in, and a terminal contact on, a monocrystalline silicon semiconductor body, comprising placing a gold foil on a silicon body, said gold foil consisting essentially of gold, unalloyed with silicon, then contacting a solid phase substance taken from the group consisting of boron and compounds of boron with oxygen with the gold foil, and heating the assembly so produced together under application of mechanical pressure, the resulting gold-silicon alloy being melted by said heating, the heating being at a temperature below the melting point of silicon, the boron penetrating through the molten alloy and advancing to the boundary region of the molten alloy and the unmelted silicon, whereby during the subsequent solidification the boron is incorporated in the silicon re-solidifying from the melt, the heating being at about 400 to 500° C.

6. A method of forming a p-n junction in, and a metallic terminal contact on, a silicon semiconductor body, comprising placing a gold foil on a silicon body, said gold foil consisting essentially of gold, unalloyed with silicon, then contacting solid phase boron with the gold foil, and heating the assembly, so made, together under application of mechanical pressure, the temperature being high enough to melt the gold-silicon alloy so produced, said boron being applied by suspending it in a liquid and admixing the suspension with a pulverulent and neutral mass, said mechanical pressure being applied to press said mass against the gold foil.

7. A method of forming a p-n junction in, and a metallic terminal contact on, a silicon semiconductor body, comprising placing a gold foil on a silicon body, said gold foil consisting essentially of gold, unalloyed with silicon, then contacting a material consisting essentially of a solid phase substance taken from the group consisting of boron and compounds of boron with oxygen with the gold foil, and heating the assembly, so produced, together under application of mechanical pressure, the resulting gold-silicon alloy being melted by the heating, the heating being at a temperature below the melting point of silicon, the boron penetrating into the molten alloy and advancing to the boundary region of the molten alloy and the unmelted silicon, and, during the subsequent solidification, the boron thereby being incorporated in the silicon resolidifying from the melt, the assembly being at least partly embedded in a pulverulent mass, the said mechanical pressure being applied to said mass to press the assembly together, during the heating.

8. A method of forming a p-n junction in, and a metallic terminal contact on, a monocrystalline silicon semiconductor body, comprising placing a gold foil on a silicon body, then contacting a boron doping substance with the gold foil, said gold foil consisting essentially of gold, unalloyed with silicon, and heating the assembly, so produced, together under application of mechanical pressure, the resulting gold-silicon alloy being melted by the heating, the heating being at a temperature below the melting point of silicon, the boron penetrating into the molten alloy and advancing to the boundary region of the molten alloy and the unmelted silicon, and, during the subsequent solidification, the boron thereby being incorporated in the silicon resolidifying from the melt, the assembly being at least partly embedded in a pulverulent mass, the said mechanical pressure being applied to said mass to press the assembly together, during the heating, the said substance being admixed with the embedding mass where the latter contacts the gold foil.

9. A method of forming a p-n junction in, and a terminal contact on, a monocrystalline silicon semiconductor body, comprising placing gold foil on a silicon body, then placing solid phase free boron upon a surface of the gold foil, and heating the assembly together under application of mechanical pressure, the temperature being high enough to melt the gold-silicon alloy so formed, but being below the melting point of silicon, the heating being at a temperature of 400 to 500° C., said gold foil consisting essentially of gold, unalloyed with silicon.

10. A method of forming a p-n junction in, and metallic terminal contacts on, a monocrystalline silicon semiconductor body, comprising placing a first gold foil on a surface area of a silicon body, said gold foil consisting essentially of gold, unalloyed with silicon, contacting another surface area of the silicon body with a gold-antimony foil, contacting a solid phase substance taken from the group consisting of boron and compounds of boron with oxygen with a surface of said first gold foil, and heating the assembly so produced together under application of mechanical pressure, the resulting gold-silicon alloy being melted by said heating, the heating being at a temperature below the melting point of silicon, the boron penetrating through the molten alloy and advancing to the boundary region of the molten alloy and the unmelted silicon, whereby during the subsequent solidification the boron is incorporated in the silicon re-solidifying from the melt, the heating being at about 400 to 500° C.

11. A method of forming a p-n junction in, and metallic terminal contacts on, a monocrystalline silicon semiconductor body, comprising placing a first gold foil on a surface area of a silicon body, said gold foil consisting essentially of gold, unalloyed with silicon, contacting another surface area of the silicon body with a gold-antimony foil, contacting a substance taken from the group consisting of boron and compounds of boron with oxygen with said first gold foil, and heating the assembly so produced together under application of mechanical pressure, the resulting gold-silicon alloy being melted by the heating, the heating being at a temperature below the melting point of silicon, the boron penetrating through the molten alloy and advancing to the boundary region of the molten alloy and the unmelted silicon, whereby during the subsequent solidification the boron is incorporated in the silicon re-solidifying from the melt, the heating being at about 400 to 500° C., the assembly being at least partly embedded in a pulverulent mass, the said mechanical pressure being applied to said mass to press the assembly together, during the heating, the said substance being admixed with the embedding mass where the latter contacts the gold foil.

References Cited in the file of this patent

UNITED STATES PATENTS

| | | |
|---|---|---|
| 1,577,995 | Wise | Mar. 23, 1926 |
| 2,510,546 | Brennan | June 6, 1950 |
| 2,725,288 | Dodds | Nov. 29, 1955 |
| 2,763,822 | Frola | Sept. 18, 1956 |
| 2,780,569 | Hewlett | Feb. 5, 1957 |
| 2,789,068 | Maserjian | Apr. 16, 1957 |
| 2,791,524 | Ozarow | May 7, 1957 |
| 2,794,846 | Fuller | June 4, 1957 |
| 2,829,999 | Gudmundsen | Apr. 8, 1958 |
| 2,877,147 | Thurmond | Mar. 10, 1959 |